United States Patent
Otsuka et al.

(10) Patent No.: US 11,999,875 B2
(45) Date of Patent: Jun. 4, 2024

(54) POLISHING SOLUTION AND POLISHING METHOD

(71) Applicant: Showa Denko Materials Co., Ltd., Tokyo (JP)

(72) Inventors: Yuya Otsuka, Tokyo (JP); Hisataka Minami, Tokyo (JP); Shingo Kobayashi, Tokyo (JP); Mayumi Komine, Tokyo (JP); Hisato Takahashi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 150 days.

(21) Appl. No.: 17/438,808

(22) PCT Filed: Jun. 6, 2019

(86) PCT No.: PCT/JP2019/022612
§ 371 (c)(1),
(2) Date: Sep. 13, 2021

(87) PCT Pub. No.: WO2020/245994
PCT Pub. Date: Dec. 10, 2020

(65) Prior Publication Data
US 2022/0251422 A1   Aug. 11, 2022

(51) Int. Cl.
*C09G 1/02* (2006.01)
*H01L 21/3105* (2006.01)

(52) U.S. Cl.
CPC .......... *C09G 1/02* (2013.01); *H01L 21/31053* (2013.01)

(58) Field of Classification Search
None
See application file for complete search history.

(56) References Cited

U.S. PATENT DOCUMENTS

| | | |
|---|---|---|
| 4,944,836 A | 7/1990 | Beyer et al. |
| 2004/0152309 A1* | 8/2004 | Carter ............... C03C 19/00 438/689 |
| 2006/0124026 A1* | 6/2006 | Kollodge ............ C23F 3/06 106/3 |
| 2007/0209287 A1* | 9/2007 | Chen ............... H01L 21/31053 257/E21.244 |
| 2014/0308879 A1* | 10/2014 | Yoshida ............ B24B 57/02 451/41 |
| 2017/0183538 A1 | 6/2017 | Kwon et al. |
| 2019/0161644 A1 | 5/2019 | Lee et al. |

FOREIGN PATENT DOCUMENTS

| | | |
|---|---|---|
| JP | 2007-053213 A | 3/2007 |
| JP | 2018-158988 A | 10/2018 |
| KR | 10-2018-0078653 A | 7/2018 |
| WO | 99/031195 A1 | 6/1999 |
| WO | 2018/179787 A1 | 10/2018 |

* cited by examiner

*Primary Examiner* — Roberts P Culbert
(74) *Attorney, Agent, or Firm* — FITCH, EVEN, TABIN & FLANNERY, LLP

(57) ABSTRACT

A polishing liquid containing: abrasive grains containing a metal oxide; at least one hydroxy acid compound selected from the group consisting of a hydroxy acid having a structure represented by General Formula (A1) below and a salt thereof; and water:

[Chemical Formula 1]

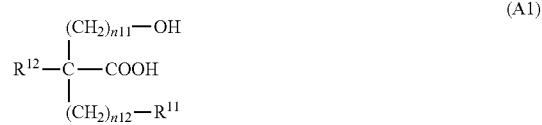

(A1)

[In the formula, $R^{11}$ represents a hydrogen atom or a hydroxy group, $R^{12}$ represents a hydrogen atom, an alkyl group, or an aryl group, n11 represents an integer of 0 or more, and n12 represents an integer of 0 or more; however, a case where both of $R^{11}$ and $R^{12}$ are a hydrogen atom is excluded.]

19 Claims, No Drawings

POLISHING SOLUTION AND POLISHING METHOD

CROSS-REFERENCE TO RELATED APPLICATIONS

This application is a U.S. national phase application filed under 35 U.S.C. § 371 of International Application No. PCT/JP2019/022612, filed Jun. 6, 2019, designating the United States, which is hereby incorporated herein by reference in its entirety.

TECHNICAL FIELD

The present invention relates to a polishing liquid and a polishing method using the same.

BACKGROUND ART

In the field of semiconductor production, with achievement of high performance of ultra LSI devices, a miniaturization technology as an extension of the conventional technology finds restriction in allowing high integration and speed-up to be compatible with each other. Accordingly, while miniaturization of semiconductor elements is being promoted, techniques for allowing vertical high integration (namely, techniques for developing multilayered wiring) have been developed. This technique is disclosed, for example, in Patent Literature 1 below.

In the process for producing a device including multilayered wiring, one of the most important techniques is a CMP (chemical mechanical polishing) technique. The CMP technique is a technique in which a material to be polished is formed on a substrate by chemical vapor deposition (CVD) or the like to obtain a base substrate, and then the surface of this base substrate is flattened. When the surface of the base substrate after being flattened has irregularities, there occur, for example, such troubles that the focusing in an exposure step is precluded, or a fine wiring structure cannot be sufficiently formed. The CMP technique is also applied, in a production process of a device, to a step of forming an element isolation region by polishing a plasma oxide material (such as BPSG, HDP-SiO$_2$, or p-TEOS), a step of forming an interlayer insulating material, a step of flattening a plug (for example, Al·Cu plug) after silicon oxide is embedded in a metal wiring, or the like.

CITATION LIST

Patent Literature

Patent Literature 1: U.S. Pat. No. 4,944,836

SUMMARY OF INVENTION

Technical Problem

However, in a step of forming an element isolation region on the substrate, silicon oxide is formed by CVD or the like so as to fill a groove which have been provided in advance on the surface of the substrate. Thereafter, the surface of the silicon oxide is flattened by CMP to form an element isolation region. In a case where the silicon oxide is formed on the substrate of which irregularities for obtaining an element isolation region are provided on the surface, the irregularities corresponding to the irregularities of the substrate also occur on the surface of the silicon oxide. In the polishing of the surface having irregularities, while a convex portion is preferentially removed, a concave portion is slowly removed to flatten the surface.

For enhancing the throughput of the semiconductor production, it is preferable that the unnecessary portion of the silicon oxide formed on the substrate is removed as rapidly as possible. For example, in the case of adopting shallow trench isolation (STI) in order to respond to the achievement of the narrow width of the element isolation region, it is required that the unnecessary portion of the silicon oxide provided on the substrate is removed at a high polishing rate.

Irregularities formed on the surface of the base substrate take a variety of forms, and the widths of irregularities, which are dependent on the wiring width; the heights of irregularities; and the wiring directions may differ according to each step or depending on the purpose of the device. However, conventionally, in the case of using the same polishing liquid, even when one base substrate can be satisfactorily polished, the other base substrate cannot be always satisfactorily polished similarity in some cases. For this reason, with respect to the polishing liquid, it is required to obtain a high polishing rate without depending on a state of irregularities on a surface to be polished of the base substrate.

An aspect of the present invention is made to solve the above-described problems and provides a polishing liquid capable of obtaining a high polishing rate without depending on a state of irregularities in the case of polishing a surface to be polished having irregularities. Another aspect of the present invention provides a polishing method using the polishing liquid.

Solution to Problem

An aspect of the present invention provides a polishing liquid containing: abrasive grains containing a metal oxide; at least one hydroxy acid compound selected from the group consisting of a hydroxy acid having a structure represented by General Formula (A1) below and a salt thereof; and water:

[Chemical Formula 1]

[In the formula, $R^{11}$ represents a hydrogen atom or a hydroxy group, $R^{12}$ represents a hydrogen atom, an alkyl group, or an aryl group, n11 represents an integer of 0 or more, and n12 represents an integer of 0 or more; however, a case where both of $R^{11}$ and $R^{12}$ are a hydrogen atom is excluded.]

Another aspect of the present invention provides a polishing method including a step of polishing a material to be polished by using the aforementioned polishing liquid.

According to the aforementioned polishing liquid and polishing method, it is possible to obtain a high polishing rate without depending on a state of irregularities in the case of polishing a surface to be polished having irregularities.

Advantageous Effects of Invention

According to an aspect of the present invention, it is possible to provide a polishing liquid capable of obtaining a high polishing rate without depending on a state of irregularities in the case of polishing a surface to be polished having irregularities. Furthermore, according to another aspect of the present invention, it is possible to provide a polishing method using the polishing liquid. These polishing liquid and polishing method can be used for polishing an insulating material (for example, silicon oxide) provided on a surface of a base substrate (for example, a semiconductor wafer).

DESCRIPTION OF EMBODIMENTS

Hereinafter, an embodiment of the present invention will be described in detail. However, the present invention is not limited to the following embodiment and can be modified variously within the scope of the spirit thereof and carried out.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in Examples. "A or B" may include either one of A and B, and may also include both of A and B. Materials listed as examples in the present specification can be used singly or in combinations of two or more, unless otherwise specifically indicated. In the present specification, when a plurality of substances corresponding to each component exist in the composition, the used amount of each component in the composition means the total amount of the plurality of substances that exist in the composition, unless otherwise specified. In the present specification, the term "film" includes a structure having a shape which is formed on a part, in addition to a structure having a shape which is formed on the whole surface, when the film has been observed as a plan view. In the present specification, the term "step" includes not only an independent step but also a step by which an intended action of the step is achieved, even though the step cannot be clearly distinguished from other steps.

<Polishing Liquid>

A polishing liquid of the present embodiment contains abrasive grains containing a metal oxide, at least one hydroxy acid compound selected from the group consisting of a hydroxy acid having a structure represented by General Formula (A1) below and a salt thereof, and water. The polishing liquid of the present embodiment can be used as a CMP polishing liquid (polishing liquid for CMP).

[Chemical Formula 2]

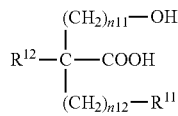

(A1)

[In the formula, $R^{11}$ represents a hydrogen atom or a hydroxy group, $R^{12}$ represents a hydrogen atom, an alkyl group, or an aryl group, n11 represents an integer of 0 or more, and n12 represents an integer of 0 or more; however, a case where both of $R^{11}$ and $R^{12}$ are a hydrogen atom is excluded.]

According to the polishing liquid of the present embodiment, a high polishing rate can be obtained without depending on a state of irregularities in the case of polishing a surface to be polished having irregularities, and for example, when various base substrates having different widths of irregularities on surfaces, which are dependent on the wiring width, are polished, a high polishing rate can be obtained without depending on the widths of irregularities. Such a polishing liquid is versatile and can be used in polishing of various base substrates with different surface states. It is speculated that the aforementioned hydroxy acid compound is likely to be strongly adsorbed to the surface of the abrasive grains containing a metal oxide and improves the activity of the surface of the abrasive grains, and thereby a high polishing rate can be obtained without depending on a state of irregularities. However, causes obtaining the above-described effect are not limited to this content. According to the polishing liquid of the present embodiment, in the case of polishing a silicon oxide surface to be polished having irregularities, for example, a polishing rate of 12000 Å/min or more can be obtained under the condition of L/S (Line/Space)=50/50 μm and a polishing rate of 19000 Å/min or more can be obtained under the condition of L/S=20/80 μm.

Incidentally, conventionally, a high polishing rate of silicon oxide can be achieved in the case of polishing a silicon oxide wafer that has a surface to be polished having no irregularities (a silicon oxide blanket wafer); on the other hand, a high polishing rate of silicon oxide cannot be achieved in the case of polishing a silicon oxide wafer that has a surface to be polished having irregularities (a silicon oxide pattern wafer) in some cases. On the other hand, according to the polishing liquid of the present embodiment, while a high polishing rate of an insulating material (for example, silicon oxide) can be achieved in the case of polishing a surface to be polished having no irregularities, a high polishing rate can be achieved without depending on a state of irregularities in the case of polishing a surface to be polished having irregularities. For example, according to the polishing liquid of the present embodiment, in the case of polishing a silicon oxide surface to be polished having no irregularities, a polishing rate of 3000 Å/min or more (preferably 5000 Å/min or more, more preferably 8000 Å/min or more) can be obtained. According to the polishing liquid of the present embodiment, a high polishing rate can be obtained in both of the case of polishing a surface to be polished having irregularities and the case of polishing a surface to be polished having no irregularities, and a high polishing rate can be obtained without depending on the surface state (presence or absence of irregularities, a density, or the like) of the surface to be polished. Note that, the mechanism by which silicon oxide is polished by CMP is still yet to be understood completely, and the cause of this phenomenon is as yet unknown.

Incidentally, when a polishing liquid having a high polishing rate of an insulating material (for example, silicon oxide), the polished surface after the completion of polishing is coarse and tends to be poor in flatness. Therefore, there is a case where the enhancement of the production efficiency is achieved by dividing the polishing treatment of the insulating material into two stages, and by using polishing liquids different in type from each other in the respective steps. In a first step (coarse polishing step), a polishing liquid having a high polishing rate of the insulating material is used to remove most of the insulating material. In a second step (finishing step), the insulating material is slowly removed, and the polished surface is finished so as to be sufficiently flat. In a case where the CMP with respect to an insulating material is divided into two or more stages, a high polishing rate takes precedence over flatness in the first step, and thus a lower polishing rate may result in lower productivity. On the other hand, according to the polishing liquid of the present embodiment, since a high polishing rate can be obtained without depending on a state of irregularities, even in a case where the CMP with respect to an insulating material (for example, silicon oxide) is divided into two or more stages, a decrease in productivity can be suppressed.

(Abrasive Grains)

The abrasive grains contain a metal oxide. The metal oxide can contain cerium oxide (ceria), alumina, silica, titania, zirconia, magnesia, mullite, or the like. The constituent components of the abrasive grains can be used singly or in combination of two or more types thereof. The abrasive grains preferably contain cerium oxide from the viewpoint of easily obtaining a high polishing rate without depending on a state of irregularities in the case of polishing a surface to be polished having irregularities.

The polishing liquid using the abrasive grains containing cerium oxide has a feature that polishing scratches occurring on the polished surface are relatively small in number. Conventionally, from the viewpoint of easily achieving a high polishing rate of a material to be polished (for example, an insulating material such as silicon oxide), a polishing liquid containing silica particles as the abrasive grains has been widely used. However, the polishing liquid using silica particles generally has a problem in that polishing scratches easily occur on the polished surface. In a device having fine patterns since the generation of 45 nm in wire width, even fine scratches having hitherto caused no problems may affect the reliability of the device.

In the case of using cerium oxide, it is preferable that the abrasive grains contain polycrystalline cerium oxide having a crystal grain boundary (for example, polycrystalline cerium oxide having multiple crystallites surrounded by crystal grain boundaries). It is considered that the polycrystalline cerium oxide particle having such a configuration is different from a simple aggregate in which single crystal particles aggregate, is made fine by the stress during polishing, and at the same time allows active surfaces (the surfaces not exposed to outside before being made fine) to appear one after another, so that a high polishing rate of a material to be polished (for example, an insulating material such as silicon oxide) can be highly maintained. Such a polycrystalline cerium oxide particle is described in detail, for example, in International Publication WO 99/31195.

The method for producing abrasive grains containing cerium oxide is not particularly limited, and examples thereof include liquid phase synthesis; and a method performing oxidation by firing or hydrogen peroxide or the like. In the case of obtaining abrasive grains containing the above-described polycrystalline cerium oxide having a crystal grain boundary, a method in which a cerium source such as cerium carbonate is fired is preferred. The temperature during the above-described firing is preferably 350° C. to 900° C. In a case where the produced cerium oxide particles aggregate, it is preferable to mechanically pulverize. The pulverizing method is not particularly limited, but for example, dry pulverization with a jet mill or the like; and wet pulverization with a planetary bead mill or the like are preferred. The jet mill is described, for example, in "Kagaku Kogaku Ronbunshu (Chemical Industrial Paper Collection)", Vol. 6, No. 5 (1980), pp. 527 to 532.

The abrasive grains may contain constituent components other than the metal oxide. Examples of the constituent components other than the metal oxide include a cerium-based compound (excluding cerium oxide), silicon nitride, α-sialon, aluminum nitride, titanium nitride, silicon carbide, and boron carbide. Examples of the cerium-based compound include cerium hydroxide, cerium ammonium nitrate, cerium acetate, cerium sulfate hydrate, cerium bromate, cerium bromide, cerium chloride, cerium oxalate, cerium nitrate, and cerium carbonate.

The lower limit of the content of the metal oxide (for example, cerium oxide) in the abrasive grains is preferably 50% by mass or more, more preferably 70% by mass or more, further preferably 90% by mass or more, particularly preferably 95% by mass or more, extremely preferably 97% by mass or more, and highly preferably 99% by mass or more, based on the total mass of the abrasive grains (the total mass of the abrasive grains contained in the polishing liquid), from the viewpoint of easily obtaining a high polishing rate of silicon oxide. The abrasive grains containing a metal oxide may be an embodiment which is substantially composed of a metal oxide (an embodiment in which substantially 100% by mass of the abrasive grains is a metal oxide). The abrasive grains may be an embodiment not containing zirconia.

The lower limit of the average particle diameter of the abrasive grains is preferably 50 nm or more, more preferably 70 nm or more, further preferably 80 nm or more, and particularly preferably 90 nm or more, from the viewpoint of easily obtaining a high polishing rate of a material to be polished (for example an insulating material such as silicon oxide). The upper limit of the average particle diameter of the abrasive grains is preferably 500 nm or less, more preferably 300 nm or less, further preferably 280 nm or less, particularly preferably 250 nm or less, extremely preferably 200 nm or less, highly preferably 180 nm or less, even more preferably 150 nm or less, further preferably 120 nm or less, and particularly preferably 100 nm or less, from the viewpoint of easily suppressing polishing scratches. From these viewpoints, the average particle diameter of the abrasive grains is preferably 50 to 500 nm.

In order to control the average particle diameter of the abrasive grains, conventionally known methods can be used. By taking the cerium oxide particles as an example, examples of the method of controlling the average particle diameter of the abrasive grains include the control of the firing temperature, the firing time, the pulverization condition, or the like mentioned above; and the application of filtration, classification, or the like. As the average particle diameter of the abrasive grains, an arithmetic average diameter obtained by measuring a polishing liquid sample having abrasive grains dispersed therein by a laser diffraction/scattering type particle size distribution analyzer can be used. The average particle diameter of the abrasive grains is a value that is measured, for example, using LA-920 (trade name) manufactured by HORIBA, Ltd. or the like.

The zeta potential (surface potential) of the abrasive grains in the polishing liquid is preferably positive (the zeta potential is more than 0 mV) from the viewpoint of easily obtaining a high polishing rate without depending on a state of irregularities in the case of polishing a surface to be polished having irregularities. The lower limit of the zeta potential of the abrasive grains is preferably 10 mV or more, more preferably 20 mV or more, further preferably 30 mV or more, particularly preferably 40 mV or more, extremely preferably 50 mV or more, and highly preferably 60 mV or more, from the viewpoint of easily obtaining a high polishing rate without depending on a state of irregularities in the case of polishing a surface to be polished having irregularities. The upper limit of the zeta potential of the abrasive grains is preferably 200 mV or less, more preferably 150 mV or less, further preferably 100 mV or less, particularly preferably 80 mV or less, and extremely preferably 70 mV or less. From these viewpoints, the zeta potential of the abrasive grains is preferably more than 0 mV and 200 mV or less, more preferably 10 to 200 mV, and further preferably 30 to 70 mV. The zeta potential of the abrasive grains can be measured, for example, by using a dynamic light scattering type zeta potential measurement apparatus (for example, trade name: DelsaNano C manufactured by Beckman Coulter, Inc.).

The content of the abrasive grains is preferably in the following range based on the total mass of the polishing liquid. The lower limit of the content of the abrasive grains is preferably 0.01% by mass or more, more preferably 0.05% by mass or more, further preferably 0.10% by mass or more, particularly preferably more than 0.10% by mass, extremely preferably 0.15% by mass or more, highly preferably 0.18% by mass or more, even more preferably more than 0.18% by mass, further preferably 0.20% by mass or more, particularly preferably 0.25% by mass or more, extremely preferably more than 0.25% by mass, highly preferably 0.30% by mass or more, even more preferably 0.50% by mass or more, further preferably 0.70% by mass or more, particularly preferably 0.90% by mass or more, and extremely preferably 0.95% by mass or more, from the viewpoint of easily achieving a high polishing rate. The upper limit of the content of the abrasive grains is preferably 10% by mass or less, more preferably 5.0% by mass or less, further preferably 3.0% by mass or less, particularly preferably 2.0% by mass or less, extremely preferably 1.5% by mass or less, and highly preferably 1.0% by mass or less, from the viewpoint of easily suppressing the aggregation of the abrasive grains and the viewpoint of easily achieving a high polishing rate. From these viewpoints, the content of the abrasive grains is preferably 0.01 to 10% by mass, more preferably 0.10 to 10% by mass, and further preferably 0.10 to 3.0% by mass.

(Hydroxy Acid Compound)

The polishing liquid of the present embodiment contains at least one hydroxy acid compound (hereinafter, referred to as "specific hydroxy acid compound") selected from the group consisting of a hydroxy acid having a structure represented by General Formula (A1) below and a salt thereof. The hydroxy acid is carboxylic acid having a hydroxy group.

[Chemical Formula 3]

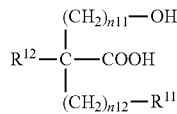

(A1)

[In the formula, $R^{11}$ represents a hydrogen atom or a hydroxy group, $R^{12}$ represents a hydrogen atom, an alkyl group, or an aryl group, n11 represents an integer of 0 or more, and n12 represents an integer of 0 or more; however, a case where both of $R^{11}$ and $R^{12}$ are a hydrogen atom is excluded.]

Examples of the salt of the hydroxy acid having a structure represented by General Formula (A1) include a salt in which the hydrogen atom of a carboxyl group is substituted with an alkali metal (for example, a sodium atom). The polishing liquid of the present embodiment may or may not contain a hydroxy acid compound other than the specific hydroxy acid compound.

The specific hydroxy acid compound preferably satisfies at least one of the following features from the viewpoint of easily obtaining a high polishing rate without depending on a state of irregularities in the case of polishing a surface to be polished having irregularities.

The number of carbon atoms of the alkyl group for $R^{12}$ is preferably 0 to 3, more preferably 0 to 2, and further preferably 1 or 2.

The aryl group for $R^{12}$ is preferably a phenyl group.

n11 is preferably 0 to 3, more preferably 0 to 2, and further preferably 0 or 1.

n12 is preferably 0 to 3, more preferably 0 to 2, further preferably 0 or 1, and particularly preferably 1.

The specific hydroxy acid compound preferably has a branched carbon chain.

The specific hydroxy acid compound preferably has no polyoxyalkylene group (for example, a polyoxyethylene group).

The specific hydroxy acid compound is preferably at least one selected from the group consisting of a hydroxy acid having a molecular weight of 90 to 200 and a salt thereof. The lower limit of the molecular weight is preferably 95 or more, more preferably 100 or more, further preferably more than 100, particularly preferably 102 or more, and extremely preferably 104 or more. The upper limit of the molecular weight is preferably 180 or less, more preferably 170 or less, further preferably 160 or less, and particularly preferably 150 or less.

The specific hydroxy acid compound preferably contains at least one selected from the group consisting of a hydroxy acid having a structure represented by General Formula (A2) below and a salt thereof and a hydroxy acid having a structure represented by General Formula (A3) below and a salt thereof, from the viewpoint of easily obtaining a high polishing rate without depending on a state of irregularities in the case of polishing a surface to be polished having irregularities.

[Chemical Formula 4]

(A2)

[In the formula, $R^{21}$ and $R^{22}$ each independently represent a hydrogen atom, an alkyl group, or an aryl group, and the total number of carbon atoms of $R^{21}$ and $R^{22}$ is 2 or more.]

[Chemical Formula 5]

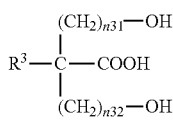
(A3)

[In the formula, $R^3$ represents a hydrogen atom, an alkyl group, or an aryl group, n31 represents an integer of 0 to 2, and n32 represents an integer of 0 or more.]

The structure represented by General Formula (A2) preferably satisfies at least one of the following features from the viewpoint of easily obtaining a high polishing rate without depending on a state of irregularities in the case of polishing a surface to be polished having irregularities.

The number of carbon atoms of the alkyl group for $R^{21}$ is preferably 0 to 3, more preferably 0 to 2, and further preferably 1 or 2.

The aryl group for $R^{21}$ is preferably a phenyl group.

The total number of carbon atoms of $R^{21}$ and $R^{22}$ is preferably 2 to 9, more preferably 2 to 6, and further preferably 2 to 4.

The structure represented by General Formula (A3) preferably satisfies at least one of the following features from the viewpoint of easily obtaining a high polishing rate without depending on a state of irregularities in the case of polishing a surface to be polished having irregularities.

$R^3$ is preferably a hydrogen atom or an alkyl group.

The number of carbon atoms of the alkyl group for $R^3$ is preferably 0 to 3, more preferably 0 to 2, and further preferably 1 or 2.

n31 is preferably 0 or 1.

n32 is preferably 0 to 3, more preferably 0 to 2, further preferably 0 or 1, and particularly preferably 1.

From the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities, the specific hydroxy acid compound preferably contains at least one selected from the group consisting of glyceric acid, mandelic acid, 2,2-bis(hydroxymethyl)propionic acid, 2,2-bis(hydroxymethyl)butyric acid, and hydroxyisobutyric acid, more preferably contains at least one selected from the group consisting of glyceric acid, 2,2-bis(hydroxymethyl)propionic acid, 2,2-bis(hydroxymethyl)butyric acid, and hydroxyisobutyric acid, and further preferably contains at least one selected from the group consisting of 2,2-bis(hydroxymethyl)butyric acid and hydroxyisobutyric acid. Examples of hydroxyisobutyric acid include 2-hydroxyisobutyric acid (also known as 2-methyllactic acid) and 3-hydroxyisobutyric acid.

The lower limit of the content of the specific hydroxy acid compound is preferably 50% by mass or more, more preferably 70% by mass or more, further preferably 90% by mass or more, particularly preferably 95% by mass or more, extremely preferably 97% by mass or more, and highly preferably 99% by mass or more, based on the total mass of a hydroxy acid compound (a hydroxy acid compound contained in the polishing liquid of the present embodiment), from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The hydroxy acid compound contained in the polishing liquid of the present embodiment may be an embodiment which is substantially composed of the specific hydroxy acid compound (an embodiment in which substantially 100% by mass of the hydroxy acid compound contained in the polishing liquid of the present embodiment is the specific hydroxy acid compound).

The content of the specific hydroxy acid compound is preferably in the following range based on the total mass of an acid component (an acid component contained in the polishing liquid of the present embodiment), from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the content of the specific hydroxy acid compound is preferably 5% by mass or more, more preferably 10% by mass or more, further preferably more than 10% by mass, particularly preferably 15% by mass or more, extremely preferably more than 15% by mass, and highly preferably 20% by mass or more. The upper limit of the content of the specific hydroxy acid compound is preferably 90% by mass or less, more preferably 85% by mass or less, further preferably 80% by mass or less, particularly preferably 75% by mass or less, and extremely preferably 70% by mass or less. From these viewpoints, the content of the specific hydroxy acid compound is preferably 5 to 90% by mass. The lower limit of the content of the specific hydroxy acid compound is preferably more than 20% by mass, more preferably 30% by mass or more, further preferably 30% by mass or more, particularly preferably 40% by mass or more, and extremely preferably 50% by mass or more, based on the total mass of the acid component, from the viewpoint of easily obtaining a particularly high polishing rate without depending on a state of irregularities in the case of polishing a surface to be polished having irregularities.

The content of the specific hydroxy acid compound is preferably in the following range based on the total mass of the polishing liquid, from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the content of the specific hydroxy acid compound is preferably 0.01% by mass or more, more preferably 0.03% by mass or more, further preferably 0.05% by mass or more, particularly preferably 0.06% by mass or more, extremely preferably 0.07% by mass or more, and highly preferably 0.075% by mass or more. The upper limit of the content of the specific hydroxy acid compound is preferably 10% by mass or less, more preferably 5.0% by mass or less, further preferably 3.0% by mass or less, particularly preferably 1.0% by mass or less, extremely preferably 0.80% by mass or less, highly preferably 0.70% by mass or less, even more preferably 0.60% by mass or less, further preferably 0.50% by mass or less, particularly preferably 0.40% by mass or less, extremely preferably less than 0.40% by mass, and highly preferably 0.30% by mass or less. From these viewpoints, the content of the specific hydroxy acid compound is preferably 0.01 to 10% by mass and more preferably 0.01 to 1.0% by mass.

The lower limit of the content of the specific hydroxy acid compound is preferably 0.08% by mass or more, more preferably 0.10% by mass or more, further preferably more than 0.10% by mass, particularly preferably 0.15% by mass or more, extremely preferably 0.20% by mass or more, highly preferably 0.25% by mass or more, and even more preferably 0.30% by mass or more, based on the total mass of the polishing liquid, from the viewpoint of easily obtaining a particularly high polishing rate without depending on a state of irregularities in the case of polishing a surface to be polished having irregularities. The upper limit of the content of the specific hydroxy acid compound is preferably 0.25% by mass or less, more preferably 0.20% by mass or less, further preferably 0.15% by mass or less, particularly preferably 0.10% by mass or less, extremely preferably less than 0.10% by mass, highly preferably 0.08% by mass or less, and even more preferably 0.075% by mass or less, based on the total mass of the polishing liquid, from the viewpoint of easily achieving a particularly high polishing rate of silicon oxide in the case of polishing a surface to be polished having no irregularities.

A ratio A1 of the content of the hydroxy acid compound (the total amount of the hydroxy acid compound contained in the polishing liquid of the present embodiment) with respect to the content of the abrasive grains (the content of the hydroxy acid compound/the content of the abrasive grains) and/or a ratio A2 of the content of the specific hydroxy acid compound with respect to the content of the abrasive grains (the content of the specific hydroxy acid compound/the content of the abrasive grains) is preferably in the following range (hereinafter, the ratio A1 and the ratio A2 are referred to as "ratio A"), from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the ratio A is preferably 0.01 or more, more preferably 0.03 or more, further preferably 0.05 or more, particularly preferably 0.06 or more, extremely preferably 0.07 or more, and highly preferably 0.075 or more. The upper limit of the ratio A is preferably 10 or less, more preferably 5.0 or less, further preferably 3.0 or less, particularly preferably 1.0 or less, extremely preferably 0.80 or less, highly preferably 0.70 or less, even more preferably 0.60 or less, further preferably 0.50 or less, particularly preferably 0.40 or less, extremely preferably less than 0.40, and highly preferably 0.30 or less. From these viewpoints, the ratio A is preferably 0.01 to 10.

The lower limit of the ratio A is preferably 0.08 or more, more preferably 0.10 or more, further preferably more than 0.10, particularly preferably 0.15 or more, extremely preferably 0.20 or more, highly preferably 0.25 or more, and even more preferably 0.30 or more, from the viewpoint of easily obtaining a particularly high polishing rate without depending on a state of irregularities in the case of polishing a surface to be polished having irregularities. The upper limit of the ratio A is preferably 0.25 or less, more preferably 0.20 or less, further preferably 0.15 or less, particularly preferably 0.10 or less, extremely preferably less than 0.10, highly preferably 0.08 or less, and even more preferably 0.075 or less, from the viewpoint of easily achieving a particularly high polishing rate of silicon oxide in the case of polishing a surface to be polished having no irregularities.

(Other Components)

The polishing liquid of the present embodiment may further contain other additives (excluding the abrasive grains and the hydroxy acid compound). Examples of the additives include an acid component other than the hydroxy acid compound; an alkali component; a water-soluble polymer; and a nonionic surfactant. The acid component and the alkali component can be used as a pH adjusting agent for adjusting pH. The polishing liquid of the present embodiment may contain a buffering agent for stabilizing pH. A buffering agent may be added as a buffer solution (a liquid containing a buffering agent). Examples of the buffer solution include an acetate buffer solution and a phthalate buffer solution.

The polishing liquid of the present embodiment may contain at least one amino acid component selected from the group consisting of an amino acid and an amino acid derivative, as an acid component other than the hydroxy acid compound. Examples of the amino acid derivatives include amino acid esters, amino acid salts, and peptides. The amino acid is a compound having both functional groups of an amino group and a carboxyl group.

Examples of the amino acid component include glycine, α-alanine, β-alanine (also known as 3-aminopropanoic acid), 2-aminobutyric acid, norvaline, valine, leucine, norleucine, isoleucine, alloisoleucine, phenylalanine, proline, sarcosine, ornithine, lysine, serine, threonine, allothreonine, homoserine, tyrosine, 3,5-diiodotyrosine, β(3,4-dihydroxyphenyl)-alanine, thyroxin, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, kynurenine, histidine, 1-methyl-histidine, 3-methyl-histidine, ergothioneine, tryptophan, glycylglycine, glycylglycylglycine, vasopressin, oxytocin, Kassinin, eledoisin, glucagon, secretin, proopiomelanocortin, enkephalin, and prodynorphin.

The amino acid component preferably contains a low-molecular-weight amino acid from the viewpoint of easily suppressing the aggregation of the abrasive grains (such as cerium oxide particles). The molecular weight of the amino acid component is preferably 300 or less, more preferably 250 or less, and further preferably 200 or less. Examples of such an amino acid include glycine (molecular weight: 75), α-alanine (molecular weight: 89), β-alanine (molecular weight: 89), serine (molecular weight: 105), histidine (molecular weight: 155), glycylglycine (molecular weight: 132), and glycylglycylglycine (molecular weight: 189). The amino acid component preferably contains glycine from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities.

The content of the acid component (for example, an amino acid component) other than the hydroxy acid compound is preferably in the following range based on the total mass of the polishing liquid. The lower limit of the content of the acid component other than the hydroxy acid compound is preferably 0.005% by mass or more, more preferably 0.01% by mass or more, further preferably 0.02% by mass or more, particularly preferably 0.03% by mass or more, extremely preferably 0.05% by mass or more, highly preferably 0.10% by mass or more, and even more preferably 0.20% by mass or more, from the viewpoint of easily achieving a sufficiently high polishing rate of silicon oxide. The upper limit of the content of the acid component other than the hydroxy acid compound is preferably 10% by mass or less, more preferably 5.0% by mass or less, further preferably 3.0% by mass or less, particularly preferably 1.0% by mass or less, extremely preferably 0.50% by mass or less, and highly preferably 0.40% by mass or less, from the viewpoint of easily achieving a sufficiently high polishing rate of silicon oxide. From these viewpoints, the content of the acid component other than the hydroxy acid compound is preferably 0.005 to 10% by mass.

A ratio B1 of the content of the amino acid component with respect to the content of the hydroxy acid compound (the total amount of the hydroxy acid compound contained in the polishing liquid of the present embodiment) (the content of the amino acid component/the content of the hydroxy acid compound), and/or a ratio B2 of the content of the amino acid component with respect to the content of the specific hydroxy acid compound (the content of the amino acid component/the content of the specific hydroxy acid compound) is preferably in the following range (hereinafter, the ratio B1 and the ratio B2 are referred to as "ratio B"), from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the ratio B is preferably 0.01 or more, more preferably 0.05 or more, further preferably 0.10 or more, particularly preferably 0.30 or more, and extremely preferably 0.50 or more. The upper limit of the ratio B is preferably 10 or less, more preferably 8.0 or less, further preferably 5.0 or less, and particularly preferably 4.0 or less. From these viewpoints, the ratio B is preferably 0.01 to 10. The upper limit of the ratio B is preferably 3.0 or less, more preferably 2.0 or less, further preferably 1.5 or less, and particularly preferably 1.0 or less, from the viewpoint of easily obtaining a particularly high polishing rate without depending on a state of irregularities in the case of polishing a surface to be polished having irregularities.

Examples of the alkali component include heterocyclic amine, alkanolamine, ammonia, sodium hydroxide, and tetramethylammonium hydroxide (TMAH). The polishing liquid of the present embodiment may not contain an alkali component.

The heterocyclic amine is an amine having at least one heterocyclic ring. Examples of the heterocyclic amine include pyrrolidine, pyrrole, imidazole, pyrazole, oxazole, thiazole, pyridine, pyrazine, pyrimidine, pyridazine, triazine, tetrazine, and derivatives thereof (compounds having skeletons of these compounds as skeletons).

As the derivatives, aminothiazole, dialkylpyrazole (for example, dimethylpyrazole such as 3,5-dialkylpyrazole), or the like can be used. The heterocyclic amine preferably contains at least one selected from the group consisting of aminothiazole and dialkylpyrazole (for example, dimethylpyrazole such as 3,5-dialkylpyrazole), from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities.

The content of the heterocyclic amine is preferably in the following range based on the total mass of the polishing liquid. The lower limit of the content of the heterocyclic amine is preferably 0.001% by mass or more, more preferably 0.005% by mass or more, and further preferably 0.01% by mass or more, from the viewpoint of easily achieving a sufficiently high polishing rate of silicon oxide. The upper limit of the content of the heterocyclic amine is preferably 10% by mass or less, more preferably 5.0% by mass or less, further preferably 3.0% by mass or less, particularly preferably 1.0% by mass or less, extremely preferably 0.50% by mass or less, and highly preferably 0.30% by mass or less, from the viewpoint of easily achieving a sufficiently high polishing rate of silicon oxide. From these viewpoints, the content of the heterocyclic amine is preferably 0.001 to 10% by mass.

The alkanolamine is a compound having a hydroxy group and an amino group bonded to an alkane skeleton. Examples of the alkanolamine include methanolamine, ethanolamine, diethanolamine, triethanolamine, propanolamine, dimethylethanolamine, N-methylethanolamine, N-polyoxypropylene ethylenediamine, aminoethylethanolamine, heptaminol, isoetharine, and sphingosine.

The content of the alkanolamine is preferably in the following range based on the total mass of the polishing liquid. The lower limit of the content of the alkanolamine is preferably 0.001% by mass or more, more preferably 0.005% by mass or more, and further preferably 0.01% by mass or more, from the viewpoint of easily achieving a sufficiently high polishing rate of silicon oxide. The upper limit of the content of the alkanolamine is preferably 10% by mass or less, more preferably 5.0% by mass or less, further preferably 3.0% by mass or less, particularly preferably 1.0% by mass or less, extremely preferably 0.50% by mass or less, and highly preferably 0.30% by mass or less, from the viewpoint of easily achieving a sufficiently high polishing rate of silicon oxide. From these viewpoints, the content of the alkanolamine is preferably 0.001 to 10% by mass.

Examples of the water-soluble polymer include polyacrylic acid-based polymers such as polyacrylic acid, a polyacrylic acid copolymer, polyacrylate, and a polyacrylic acid copolymer salt; polymethacrylic acid-based polymers such as polymethacrylic acid and polymethacrylate; polyacrylamide; polydimethylacrylamide; polysaccharides such as alginic acid, pectinic acid, carboxymethylcellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and polyglycerin derivatives; and polyethylene glycol.

The polishing liquid of the present embodiment may not contain a water-soluble polymer. The polishing liquid of the present embodiment may not contain a water-soluble polymer. For example, the polishing liquid of the present embodiment may not contain at least one selected from the group consisting of polyvinyl alcohol, polyvinylpyrrolidone, polyglycerol, and polyethylene glycol.

Examples of the nonionic surfactant include ether-type surfactants such as polyoxypropylene polyoxyethylene alkyl ether, polyoxyethylene alkyl ether, polyoxyethylene alkylaryl ether, polyoxyethylene polyoxypropylene ether derivatives, polyoxypropylene glyceryl ether, oxyethylene adducts of polyethylene glycol, oxyethylene adducts of methoxypolyethylene glycol, oxyethylene adducts of acethylene-based diols; ester-type surfactants such as sorbitan fatty acid ester and glycerol borate fatty acid ester; amino ether-type surfactants such as polyoxyethylene alkylamine; ether ester-type surfactants such as polyoxyethylene sorbitan fatty acid ester, polyoxyethylene glycerol borate fatty acid ester, and polyoxyethylene alkyl ester; alkanolamide-type surfactants such as fatty acid alkanolamide and polyoxyethylene fatty acid alkanolamide; oxyethylene adducts of acetylene-based diols; polyvinylpyrrolidone; polyacrylamide; polydimethylacrylamide; and polyvinyl alcohol. The polishing liquid of the present embodiment may not contain a nonionic surfactant.

The upper limit of the content of the polymer compound having a hydroxy group in the polishing liquid of the present embodiment may be less than 0.01% by mass, 0.005% by mass or less, 0.001% by mass or less, 0.0001% by mass or less, or less than 0.0001% by mass, based on the total mass of the polishing liquid. The polishing liquid of the present embodiment may not contain a polymer compound having a hydroxy group.

The upper limit of the content of the polymer compound having an amide group in the polishing liquid of the present embodiment may be less than 0.01% by mass, 0.005% by mass or less, 0.001% by mass or less, 0.0001% by mass or less, or less than 0.0001% by mass, based on the total mass of the polishing liquid. The polishing liquid of the present embodiment may not contain a polymer compound having an amide group. For example, the polishing liquid of the present embodiment may not contain poly-N-vinylacetamide.

The upper limit of the content of the compound having a cyclic structure (for example, a compound having two or more cyclic structures) in the polishing liquid of the present embodiment may be less than 0.01% by mass, 0.005% by mass or less, 0.001% by mass or less, less than 0.001% by mass, 0.0001% by mass or less, or less than 0.0001% by mass, based on the total mass of the polishing liquid. The polishing liquid of the present embodiment may not contain a compound having a cyclic structure (for example, a compound having two or more cyclic structures).

The upper limit of the content of a compound having a polyalkylene chain in the polishing liquid of the present embodiment may be less than 0.01% by mass, 0.005% by mass or less, 0.001% by mass or less, 0.0001% by mass or less, or less than 0.0001% by mass, based on the total mass of the polishing liquid. The polishing liquid of the present embodiment may not contain a compound having a polyalkylene chain.

The upper limit of the content of a water-soluble polyamide in the polishing liquid of the present embodiment may be less than 0.0001% by mass based on the total mass of the polishing liquid. The polishing liquid of the present embodiment may not contain a water-soluble polyamide.

The upper limit of the content of an azo compound (for example, an azo derivative) in the polishing liquid of the present embodiment may be less than 0.025% by mass, 0.02% by mass or less, 0.01% by mass or less, 0.005% by mass or less, 0.001% by mass or less, 0.0001% by mass or less, or less than 0.0001% by mass, based on the total mass of the polishing liquid. The polishing liquid of the present embodiment may not contain an azo compound (for example, an azo derivative).

The upper limit of the content of an oxidizing agent in the polishing liquid of the present embodiment may be less than 0.003 mol/L or 0.001 mol/L or less, based on the entire polishing liquid. The polishing liquid of the present embodiment may not contain an oxidizing agent.

(Water)

The polishing liquid of the present embodiment contains water. Examples of water include deionized water and ultrapure water. The content of water is not particularly limited, and may be the remainder of the polishing liquid excluding the content of the other constituent components.

The total amount of the abrasive grains and water is preferably in the following range based on the total mass of the polishing liquid, from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the total amount of the abrasive grains and water is preferably 95% by mass or more, more preferably 96% by mass or more, further preferably 97% by mass or more, particularly preferably 98% by mass or more, extremely preferably 99% by mass or more, highly preferably more than 99% by mass, even more preferably 99.1% by mass or more, further preferably 99.2% by mass or more, particularly preferably 99.3% by mass or more, and extremely preferably 99.4% by mass or more. The upper limit of the total amount of the abrasive grains and water is preferably less than 100% by mass, more preferably 99.9% by mass or less, and further preferably 99.8% by mass or less. From these viewpoints, the total amount of the abrasive grains and water is preferably 95% by mass or more and less than 100% by mass. The total amount of the abrasive grains and water is preferably more than 99.4% by mass, more preferably 99.5% by mass or more, and further preferably 99.6% by mass or more, from the viewpoint of easily achieving a particularly high polishing rate of silicon oxide in the case of polishing a surface to be polished having no irregularities.

The total amount of the hydroxy acid compound and water is preferably in the following range based on the total mass of the polishing liquid, from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The lower limit of the total amount of the hydroxy acid compound and water is preferably 95% by mass or more, more preferably 96% by mass or more, further preferably 97% by mass or more, particularly preferably 98% by mass or more, extremely preferably 98.2% by mass or more, highly preferably 98.4% by mass or more, even more preferably 98.6% by mass or more, and further preferably 98.7% by mass or more. The upper limit of the total amount of the hydroxy acid compound and water is preferably less than 100% by mass, more preferably 99.8% by mass or less, further preferably 99.5% by mass or less, particularly preferably 99.2% by mass or less, extremely preferably 99% by mass or less, and highly preferably less than 99% by mass. From these viewpoints, the total amount of the hydroxy acid compound and water is preferably 95% by mass or more and less than 100% by mass.

The lower limit of the total amount of the abrasive grains, the hydroxy acid compound, and water is preferably 95% by mass or more, more preferably 96% by mass or more, further preferably 97% by mass or more, particularly preferably 98% by mass or more, extremely preferably 99% by mass or more, highly preferably 99.2% by mass or more, even more preferably 99.4% by mass or more, further preferably 99.6% by mass or more, particularly preferably 99.8% by mass or more, extremely preferably 99.9% by mass or more, and highly preferably 99.95% by mass or more, based on the total mass of the polishing liquid, from the viewpoint of easily obtaining a high polishing rate without depending on a state of irregularities in the case of polishing a surface to be polished having irregularities and the viewpoint of easily achieving a high polishing rate of silicon oxide in the case of polishing a surface to be polished having no irregularities. The total amount of the abrasive grains, the hydroxy acid compound, and water may be 100% by mass or less than 100% by mass.

(pH)

The lower limit of the pH of the polishing liquid of the present embodiment is preferably 1.0 or more, more preferably 1.5 or more, further preferably 2.0 or more, particularly preferably 2.2 or more, extremely preferably 2.4 or more, highly preferably 2.5 or more, even more preferably 3.0 or more, further preferably 3.2 or more, particularly preferably 3.4 or more, and extremely preferably more than 3.4, from the viewpoint of easily achieving a sufficiently high polishing rate of silicon oxide. The upper limit of the pH is preferably 7.0 or less, more preferably 6.5 or less, further preferably 6.0 or less, particularly preferably 5.5 or less, extremely preferably 5.0 or less, highly preferably 4.5 or less, even more preferably 4.0 or less, further preferably less than 4.0, particularly preferably 3.8 or less, and extremely preferably 3.5 or less, from the viewpoint of easily achieving a sufficiently high polishing rate of silicon oxide. From these viewpoints, the pH of the polishing liquid is preferably 1.0 to 7.0, more preferably 3.0 to 7.0, further preferably 3.0 to 6.0, particularly preferably 3.0 to 5.0, and extremely preferably 3.5 to 5.0. The pH of the polishing liquid is defined as the pH at a liquid temperature of 25° C.

The pH of the polishing liquid of the present embodiment can be measured by a pH meter (for example, Model No. PHL-40 manufactured by Denki Kagaku Keiki Co., Ltd.). For example, after performing 3-point calibration using a standard buffer solution (phthalate pH buffer solution, pH: 4.01; neutral phosphate pH buffer solution, pH: 6.86; borate pH buffer solution, pH: 9.18), an electrode is placed in the polishing liquid, and the pH upon stabilization after an elapse of 3 minutes or longer is measured by the measurement apparatus. The liquid temperature of both the standard buffer solution and the polishing liquid are set to 25° C.

(Storage Form and Usage Form)

The polishing liquid of the present embodiment may be stored as a one-pack type polishing liquid containing at least abrasive grains and the hydroxy acid compound, or as a multi-pack type (for example, two-pack type) polishing liquid set containing constituent components of the polishing liquid divided into a slurry (first liquid) and an additive liquid (second liquid) such that the slurry and additive liquid are mixed to form the polishing liquid. The slurry contains, for example, at least abrasive grains and water. The additive liquid contains, for example, at least the hydroxy acid compound and water.

In the polishing liquid set of the present embodiment, the slurry and the additive liquid are mixed immediately before polishing or during polishing to prepare the polishing liquid. Furthermore, a one-pack type polishing liquid may be stored as a stock solution for a polishing liquid with a reduced liquid medium content, and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

<Polishing Method>

A polishing method of the present embodiment includes a polishing step of polishing a material to be polished by using the polishing liquid of the present embodiment. The polishing step is, for example, a step of polishing an insulating material (for example, an insulating material such as silicon oxide) of a base substrate having the insulating material on the surface thereof by using the polishing liquid of the present embodiment. The polishing step is, for example, a step of polishing a material to be polished by a polishing member while supplying the polishing liquid of the present embodiment between a material to be polished (for example, an insulating material) and the polishing member (such as a polishing pad). The material to be polished may contain an insulating material, may contain an inorganic insulating material, and may contain silicon oxide. The polishing step is, for example, a step of flattening a base substrate having an insulating material (for example, an insulating material such as silicon oxide) on the surface thereof by the CMP technique using a polishing liquid in which the content of each component, the pH, and the like are adjusted. The material to be polished may be in the form of a film (film to be polished) and may be an insulating film such as a silicon oxide film.

The polishing step may be a step of polishing a base substrate including a substrate having irregularities on the surface thereof, a stopper provided on the substrate along the surface shape of the substrate, and an insulating material (for example, silicon oxide) provided on the stopper along the shape of the stopper. The polishing step may have a first step (coarse polishing step) of polishing and removing an insulating material until a part positioned on a convex portion of a substrate surface in the stopper is exposed and a second step (finishing step) of polishing and removing the stopper and the insulating material after the first step. The polishing liquid and the polishing method of the present embodiment can be used in at least one selected from the group consisting of the first step and the second step. The stopper may contain silicon nitride. The stopper may be in the form of a film (stopper film) and may be a silicon nitride film.

The polishing method of the present embodiment is suitable for polishing the base substrate having a material to be polished (for example, an insulating material such as silicon oxide) on the surface thereof in the production process of a device as described below. Examples of the device include a discrete semiconductor such as diode, transistor, compound semiconductor, thermistor, varistor, and thyristor; a memory element such as DRAM (dynamic random access memory), SRAM (static random access memory), EPROM (erasable programmable read-only memory), mask ROM (mask read-only memory), EEPROM (electrically erasable programmable read-only memory), and flash memory; a logic circuit element such as a microprocessor, DSP, and ASIC; an integrated circuit element such as a compound semiconductor typified by MMIC (monolithic microwave integrated circuit); a hybrid integrated circuit (hybrid IC) and a photoelectric conversion element such as light emitting diode and charge-coupled element.

The polishing method of the present embodiment is particularly suitable for flattening of a surface of a base substrate having step height (irregularities) on the surface. Examples of the base substrate include logic semiconductor devices. The material to be polished may have sections with the concave portion or convex portion in a T-shaped or lattice-shaped fashion when viewed from above. For example, an object to be polished having a material to be polished may be a semiconductor substrate having a memory cell. According to the present embodiment, an insulating material (for example, an insulating material such as silicon oxide) provided on a surface of a semiconductor device (a DRAM, a flash memory, or the like) including a semiconductor substrate having a memory cell can also be polished at a high rate. According to the present embodiment, an insulating material (for example, an insulating material such as silicon oxide) provided on a surface of a 3D-NAND flash memory in which coarseness/fineness dependence property is likely to be exhibited can also be polished at a high polishing rate while securing high flatness.

The polishing method of the present embodiment can polish a material to be polished having a pattern in which a ratio of a line width (L: Line) with respect to the sum of the line width and a space width (S: Space) is in the following range. The ratio of the line width may be 10% or more, 20% or more, 30% or more, 40% or more, or 50% or more. The ratio of the line width may be 60% or less, 50% or less, 40% or less, 30% or less, or 20% or less. The sum of the line width and the space width may be 50 µm or more, 80 µm or more, or 100 µm or more. The sum of the line width and the space width may be 200 µm or less, 150 µm or less, 120 µm or less, or 100 µm or less. The polishing liquid of the present embodiment can be used in polishing of a material to be polished having a pattern in which the ratio of the line width is in these ranges. The present embodiment can provide a method for producing a polishing liquid, the method including a selection step of selecting a polishing liquid based on a polishing rate when a material to be polished (for example, silicon oxide) having a pattern with L/S=50/50 µm is polished and a polishing rate when a material to be polished (for example, silicon oxide) having a pattern with L/S=20/80 µm is polished. In the selection step, the polishing liquid may be selected based on the fact that the polishing rate when a material to be polished (for example, silicon oxide) having a pattern with L/S=50/50 µm is polished is 12000 Å/min or more and the polishing rate when a material to be polished (for example, silicon oxide) having a pattern with L/S=20/80 µm is polished is 19000 Å/min or more.

The object to be polished is not limited to a base substrate having silicon oxide covering the entire surface, and may be a base substrate further having silicon nitride, polycrystalline silicon, or the like other than the silicon oxide on the surface thereof. The object to be polished may be a base substrate in which an insulating material (for example, an inorganic insulating material such as silicon oxide, glass, or silicon nitride), polysilicon, Al, Cu, Ti, TiN, W, Ta, TaN, or the like is formed on a wiring board having a predetermined wiring.

As the polishing apparatus, for example, an apparatus provided with a holder for holding a base substrate, a polishing platen to which a polishing pad is attached, and a means for supplying a polishing liquid onto the polishing pad is suitable. Examples of the polishing apparatus include a polishing apparatus (Model No.: EPO-111, EPO-222, FREX200, FREX300, or the like) manufactured by EBARA CORPORATION and a polishing apparatus (trade name: Mirra3400, Reflexion polishing machine or the like) manufactured by Applied Materials, Inc.

As the polishing pad, common unwoven cloth, a foamed body, an unfoamed body, or the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. Particularly, from the viewpoint of easily obtaining an excellent polishing rate and excellent flatness, the material for the polishing pad is preferably at least one selected from the group consisting of a foamed polyurethane and a non-foamed polyurethane. It is preferable that the polishing pad is subjected to grooving so that the polishing liquid is pooled.

Polishing conditions are not particularly limited, but the rotation speed of the polishing platen is preferably 200 rpm ($min^{-1}$) or less from the viewpoint that the base substrate is not let out, and the pressure (processing load) to be applied to the base substrate is preferably 100 kPa or less from the viewpoint of easily suppressing scratches on the polished surface. The polishing liquid is preferably continuously supplied to the polishing pad with a pump or the like during polishing. The amount supplied for this is not limited, but it is preferable that the surface of the polishing pad is always covered with the polishing liquid.

It is preferable to sufficiently wash the base material in running water after the completion of polishing, then perform drying after removing droplets, which have attached onto the base substrate, with the use of a spin dry or the like.

Polishing in this manner allows irregularities on the surface to be eliminated, and thereby a smooth surface across the entire base substrate can be obtained. By repeating the formation of a material to be polished and the polishing thereof a predetermined number of times, a base substrate having desired number of layers can be produced.

The base substrate obtained in this way can be used as various electronic components and machine components. Specific examples thereof include semiconductor elements; optical glass for a photomask, a lens, or a prism; inorganic conductive films of ITO or the like; optical integrated circuits/optical switching elements/optical waveguides constituted with glass and crystalline materials; optical single crystals such as end faces of optical fibers and scintillators; solid laser single crystals; sapphire substrates for blue laser LEDs; semiconductor single crystals of SiC, GaP, GaAs, or the like; glass substrates for magnetic discs; and magnetic heads.

EXAMPLES

Hereinafter, the present invention will be described in more detail with reference to Examples. However, the present invention is not limited to these Examples without departing from the technical idea of the present invention. For example, the type of materials of the polishing liquid and the blending ratio thereof may be types and ratios other than the types and ratios described in the present examples, and the composition and the structure of the object to be polished may also be compositions and structures other than the compositions and the structures described in the present examples.

<Preparation of Abrasive Grains>

40 kg of cerium carbonate hydrate was placed in an alumina container and fired at 830° C. for 2 hours in air to obtain 20 kg of yellowish-white powder. The phase identification of this powder was performed by an X-ray diffraction method, and it was confirmed that this powder contained polycrystalline cerium oxide. The particle diameter of the powder obtained by firing was observed with a SEM and was found to be 20 to 100 µm. Next, 20 kg of the cerium oxide powder was dry pulverized using a jet mill. The cerium oxide powder after the pulverization was observed with a SEM, and was found to include particles containing polycrystalline cerium oxide having a crystal boundary. Furthermore, the specific surface area of the cerium oxide powder was 9.4 $m^2/g$. The measurement of the specific surface area was performed by the BET method.

<Preparation of CMP Polishing Liquid>

15 kg of the aforementioned cerium oxide powder and 84.7 kg of deionized water were placed in a container and mixed. Furthermore, 0.3 kg of 1 N acetic acid aqueous solution was added and stirred for 10 minutes to thereby obtain a cerium oxide mixed liquid. This cerium oxide mixed liquid was send to another container over 30 minutes. Meanwhile, in the sending pipe, the cerium oxide mixed liquid was irradiated with ultrasonic wave at an ultrasonic wave frequency of 400 kHz.

CMP polishing liquids containing 1.0% by mass of the aforementioned abrasive grains, the acid components described in Tables 1 to 3 (the hydroxy acid compound and other acid components), and deionized water (remainder) were obtained.

The average particle diameter of the abrasive grains in the polishing liquid was measured using a laser diffraction/scattering type particle size distribution analyzer (trade name: LA-920 manufactured by HORIBA, Ltd.), and the average particle diameter in any cases was found to be 90 nm.

The pH of the CMP polishing liquid was measured under the following conditions. The pH in Examples and Comparative Examples other than Comparative Example 1 was 3.5 and the pH in Comparative Example 1 was 5.0.

Measurement temperature: 25° C.
Measurement apparatus: Model No. PHL-40 manufactured by Denki Kagaku Keiki Co., Ltd.
Measurement method: After performing 3-point calibration using a standard buffer solution (phthalate pH buffer solution, pH: 4.01 (25° C.); neutral phosphate pH buffer solution, pH: 6.86 (25° C.); borate pH buffer solution, pH: 9.18), an electrode was placed in the polishing liquid, and the pH upon stabilization after an elapse of 3 minutes or longer was measured by the measurement apparatus.

An adequate amount of a ceria slurry was introduced into trade name: DelsaNano C manufactured by Beckman Coulter, Inc. and measurement was performed twice at 25° C. The average value of the displayed zeta potentials was obtained as the zeta potential. The zeta potential of the ceria particles in the ceria slurry was +60 mV.

<Polishing Characteristic Evaluation>
(Preparation of Wafer)

A blanket wafer having a silicon oxide film on the surface thereof was polished using the aforementioned CMP polishing liquid under the polishing conditions below to obtain a polishing rate (blanket wafer polishing rate). The blanket wafer is a wafer that has a silicon oxide film having a film thickness of 1000 nm disposed on a silicon substrate having a diameter of 200 mm.

A pattern wafer having a silicon oxide film with irregularities as a film to be polished was polished using the aforementioned CMP polishing liquid under the polishing conditions below to obtain a polishing rate. The pattern wafer was obtained in such a manner that a silicon nitride film was formed as a stopper film on a part of a silicon substrate having a diameter of 200 mm, a part of the silicon substrate on which the silicon nitride film was not formed was then etched at 350 nm to form a concave portion, and then a 600-nm silicon oxide film was formed on the stopper film and in the concave portion by a plasma CVD method. The pattern wafer has patterns with L/S=50/50 μm and L/S=20/80 μm.

[Polishing Conditions]
Polishing apparatus: Polishing machine for CMP Mirra 3400 (manufactured by Applied Materials, Inc.)
Polishing pad: Porous urethane pad IC-1010 (manufactured by Rohm and Haas Japan K.K.)
Polishing pressure: 3.0 psi (20.7 kPa)
Number of revolutions of platen: 126 rpm
Number of revolutions of head: 125 rpm
Amount of CMP polishing liquid to be supplied: 200 mL/min
Polishing time: 30 seconds (Calculation of Blanket Wafer Polishing Rate)

The film thicknesses before and after polishing of the silicon oxide film were measured using a light interference type film thickness measuring apparatus (apparatus name: F80) manufactured by Filmetrics Japan, Inc. The film thicknesses at 79 points positioned on the line (diameter) passing through the center of the wafer with an equal interval were measured, and an average value thereof was obtained as the film thickness. The polishing rate was calculated by the following formula based on the film thicknesses before and after polishing and the polishing time. Results are shown in Tables 1 to 3.

Polishing rate[Å/min]=(Film thickness[Å]before polishing−Film thickness[Å]after polishing)/Polishing time[min]

(Calculation of Pattern Wafer Polishing Rate)

The film thicknesses before and after polishing of the silicon oxide film were measured using a light interference type film thickness apparatus (apparatus name: Nanospec AFT-5100) manufactured by Nanometrics Inc. The polishing rate was calculated by the following formula based on the film thicknesses before and after polishing and the polishing time. Results are shown in Tables 1 to 3.

Polishing rate[Å/min]=(Film thickness[Å]before polishing−Film thickness[Å]after polishing)/Polishing time[min]

TABLE 1

| | | Example | | | | |
|---|---|---|---|---|---|---|
| | | 1 | 2 | 3 | 4 | 5 |
| Hydroxy acid | Type | 2,2-Bis(hydroxymethyl)propionic acid | | | | |
| | Content [% by mass] | 0.30 | 0.30 | 0.30 | 0.15 | 0.075 |
| Other acid component | Type | Glycine | Aminothiazole | 3,5-Dimethylpyrazole | Glycine | Glycine |
| | Content [% by mass] | 0.30 | 0.10 | 0.15 | 0.075 | 0.30 |
| Polishing rate [Å/min] | Blanket wafer | 8600 | 8950 | 8900 | 9148 | 9944 |
| | Pattern wafer L/S = 50/50 μm | 16500 | 18900 | 19000 | 14971 | 14022 |
| | Pattern wafer L/S = 20/80 μm | 26000 | 28400 | 27100 | 23513 | 19970 |

TABLE 2

| | | Example | | | |
|---|---|---|---|---|---|
| | | 6 | 7 | 8 | 9 |
| Hydroxy acid | Type | 2,2-Bis(hydroxymethyl)butyric acid | DL-glyceric acid | 2-Hydroxyisobutyric acid | Mandelic acid |
| | Content [% by mass] | 0.30 | 0.30 | 0.30 | 0.30 |
| Other acid component | Type | Glycine | Glycine | Glycine | Glycine |
| | Content [% by mass] | 0.30 | 0.30 | 0.30 | 0.30 |
| Polishing rate [Å/min] | Blanket wafer | 8800 | 8400 | 9300 | 3668 |
| | Pattern wafer L/S = 50/50 μm | 19500 | 15100 | 18900 | 12014 |
| | Pattern wafer L/S = 20/80 μm | 27000 | 23000 | 28300 | 24158 |

TABLE 3

| | | Comparative Example | | | | | | |
|---|---|---|---|---|---|---|---|---|
| | | 1 | 2 | 3 | 4 | 5 | 6 | 7 |
| Hydroxy acid | Type | — | DL-lactic acid | — | Glycolic acid | Malic acid | DL-serine | Gluconic acid |
| | Content [% by mass] | — | 0.30 | — | 0.30 | 0.30 | 0.30 | 0.30 |
| Other acid component | Type | — | Glycine | Glycine | Glycine | Glycine | Propionic acid | Glycine |
| | Content [% by mass] | — | 0.30 | 0.30 | 0.30 | 0.30 | 0.10 | 0.15 |
| | Type | — | — | Propionic acid | — | — | — | — |
| | Content [% by mass] | — | — | 0.30 | — | — | — | — |
| Polishing rate [Å/min] | Blanket wafer | 6800 | 7400 | 6600 | 6300 | 360 | 7784 | 9338 |
| | Pattern wafer L/S = 50/50 μm | 11000 | 13200 | 13500 | 12600 | 3400 | 11292 | 11600 |
| | Pattern wafer L/S = 20/80 μm | 15200 | 18000 | 17200 | 16900 | 11800 | 18674 | 17036 |

It is found that, in Examples, a high polishing rate can be obtained without depending on a state of irregularities in the case of polishing a surface to be polished having irregularities.

The invention claimed is:

1. A polishing liquid comprising: abrasive grains containing a metal oxide; at least one hydroxy acid compound selected from the group consisting of a hydroxy acid having a structure represented by General Formula (A1) below and a salt thereof; and water:

wherein in the formula, $R^{11}$ represents a hydrogen atom or a hydroxy group, $R^{12}$ represents a hydrogen atom, an alkyl group, or an aryl group, n11 represents an integer of 0 or more, and n12 represents an integer of 0 or more; however, a case where both of $R^{11}$ and $R^{12}$ are a hydrogen atom is excluded and a case where $R^{11}$ is a hydrogen atom, $R^{12}$ is a methyl group, n11 is 0, and n12 is 0 is excluded, and a ratio of a content of the hydroxy acid compound with respect to a content of the abrasive grains is 0.01 to 0.50.

2. The polishing liquid according to claim 1, wherein the n11 in the General Formula (A1) is 0 or 1.

3. The polishing liquid according to claim 1, wherein the n12 in the General Formula (A1) is 1.

4. The polishing liquid according to claim 1, wherein the hydroxy acid compound contains at least one selected from the group consisting of glyceric acid, 2,2-bis(hydroxymethyl)propionic acid, 2,2-bis(hydroxymethyl)butyric acid, and hydroxyisobutyric acid.

5. The polishing liquid according to claim 1, wherein a content of the hydroxy acid compound is 0.01 to 1.0% by mass.

6. The polishing liquid according to claim 1, wherein the metal oxide contains cerium oxide.

7. The polishing liquid according to claim 1, wherein a content of the abrasive grains is 0.10 to 3.0% by mass.

8. The polishing liquid according to claim 1, further comprising an amino acid component.

9. The polishing liquid according to claim 8, wherein the amino acid component contains glycine.

10. The polishing liquid according to claim 1, wherein a pH is 1.0 to 7.0.

11. The polishing liquid according to claim 1, wherein a pH is 3.0 to 5.0.

12. The polishing liquid according to claim 1, further comprising an alkali component.

13. The polishing liquid according to claim 12, wherein the alkali component contains aminothiazole.

14. The polishing liquid according to claim 12, wherein the alkali component contains dimethylpyrazole.

15. The polishing liquid according to claim 1, wherein the hydroxy acid compound contains at least one selected from the group consisting of glyceric acid, 2,2-bis(hydroxymethyl)propionic acid, 2,2-bis(hydroxymethyl)butyric acid, mandelic acid, and hydroxyisobutyric acid.

16. A polishing method comprising a step of polishing a material to be polished by using the polishing liquid according to claim 1.

17. The polishing method according to claim 16, wherein the material to be polished contains silicon oxide.

18. The polishing liquid according to claim 1, wherein the hydroxy acid compound contains hydroxyisobutyric acid.

19. The polishing liquid according to claim 1, wherein the hydroxy acid compound contains mandelic acid.

* * * * *